United States Patent [19]
Lu et al.

[11] Patent Number: 6,166,955
[45] Date of Patent: Dec. 26, 2000

[54] APPARATUS AND METHOD FOR PROGRAMMING OF FLASH EPROM MEMORY

[75] Inventors: Wenpin Lu, I-Lan; Ming-Shang Chen; Mam-Tsung Wang, both of Hsinchu; Baw-Chyuan Lin, Yunlin, all of Taiwan

[73] Assignee: Macronix International Co., Ltd., Hsinchu, Taiwan

[21] Appl. No.: 09/350,862

[22] Filed: Jul. 9, 1999

[51] Int. Cl.[7] ................................................. G11C 16/04
[52] U.S. Cl. ................................. 365/185.18; 365/185.23
[58] Field of Search ........................... 365/185.18, 185.23

[56] References Cited

U.S. PATENT DOCUMENTS

| | | | |
|---|---|---|---|
| 5,218,571 | 6/1993 | Norris | 365/189.09 |
| 5,467,306 | 11/1995 | Kaya et al. | 365/185.2 |
| 5,487,033 | 1/1996 | Keeney et al. | 365/185.19 |
| 5,530,669 | 6/1996 | Oyama | 365/185.01 |
| 5,923,585 | 7/1999 | Wong et al. | 365/185.03 |
| 5,991,199 | 11/1999 | Brigati et al. | 365/185.12 |

*Primary Examiner*—David Nelms
*Assistant Examiner*—Connie C. Yoha
*Attorney, Agent, or Firm*—Mark A. Haynes; Haynes & Beffel LLP

[57] ABSTRACT

An apparatus for programming selected floating gate storage transistors in a data storage device includes a voltage supply circuit, coupled to the control gate and the source of a selected floating gate storage transistor, to supply a gate programming potential across the control gate and the source to move charge in the floating gate. Circuitry, coupled to the selected floating gate storage transistor, maintains drain current of the selected floating gate transistor at a substantially stable value during programming. In one example, the circuitry is a stable current source in parallel with a load coupled to the source of the selected floating gate transistor. The stable current source, in one embodiment, is a current mirror designed to supply a fixed current level. The load may be a resistor chosen to control a slope of a curve of source current versus source voltage such that drain current variation is limited. The load may be a diode chosen to control a slope of a curve of source current versus source voltage such that drain current variation is limited.

40 Claims, 10 Drawing Sheets

APPARATUS AND METHOD FOR PROGRAMMING OF FLASH EPROM MEMORY

BACKGROUND

1. Field of the Invention

The invention relates to flash EPROM memory, in particular to a method and apparatus of improved programming of flash EPROM memory.

2. Description of Related Art

EPROM memory is electrically erasable programmable read only memory. Such memory has an advantage of retaining its contents even when the power is turned off. Flash memory is a kind of EPROM that typically can be reprogrammed and erased in blocks at a time. A flash memory cell typically includes a drain region, source region, and a channel between the drain and source. A floating gate is typically disposed above the channel. A control gate is typically disposed above the floating gate. A cell is programmed by bringing electric charge, in the form of electrons, onto the floating gate.

Various programming methods have been proposed for programming flash EPROMs. Programming a flash EPROM requires electric current. Some of the goals of improved programming of flash EPROM include reducing the program current and increasing the program efficiency.

For example, to improve programming, a resistor may be connected to the source side of cells to bias the source junction. According to another method, a diode or resistor may be placed at the source side of a cell with a feedback circuit to control gate voltage of cells being programmed to further compact the threshold voltage distribution. In another method, the source junction of the cells is biased by applying a source bias that is varied with the conductivity of reference cells to track process variation. For examples of EPROM systems, please see the following patents, which are incorporated herein by reference: U.S. Pat. No. 5,487,033 by S. Keeney; U.S. Pat. No. 5,533,020 by S. Keeney; U.S. Pat. No. 5,467,306 by C. Kaya; and U.S. Pat. No. 5,218,571 by C. Norris.

SUMMARY OF THE INVENTION

The invention includes an apparatus for programming selected floating gate storage transistors in a data storage device. The data storage device includes a plurality of floating gate storage transistors having respective control gates, sources, and drains. The apparatus includes a voltage supply circuit, coupled to the control gate and the source of a selected floating gate storage transistor, to supply a gate programming potential across the control gate and the source to move charge in the floating gate. The apparatus also includes circuitry, coupled to the selected floating gate storage transistor. The circuitry is selected to maintain drain current of the selected floating gate transistor at a substantially stable value during programming.

According to an embodiment of the invention, the circuitry comprises a stable current source in parallel with a load. The stable current source is coupled to the source of the selected floating gate transistor. The stable current source, according to an embodiment of the invention, comprises a current mirror designed to supply a fixed current level. The current mirror is coupled to the source of the selected floating gate transistor. The stable current source may comprise a MOS device. The load may comprise a resistor chosen to control a slope of a curve of source current versus source voltage such that drain current variation is limited. The load may comprise a diode chosen to control a slope of a curve of source current versus source voltage such that drain current variation is limited.

According to an embodiment of the invention, a substrate of the selected floating gate storage transistor is biased at a negative voltage, allowing control gate voltage and drain voltage to be reduced.

According to one aspect of the invention, control circuitry is coupled to the voltage supply circuit to vary the gate programming potential during a programming interval. According to another aspect of the invention, a rate of varying the gate programming potential is chosen to improve gate injection efficiency for a cell with a relatively low threshold voltage.

Another embodiment of the invention comprises an apparatus for programming selected floating gate storage transistors in a data storage device including a plurality of floating gate storage transistors having respective control gates, sources, and drains. The apparatus includes a voltage supply circuit, coupled to the control gate and the source of a selected floating gate storage transistor, to supply a gate programming potential across the control gate and the source to move charge in the floating gate. The apparatus also comprises a bias component, coupled to the source of the selected floating gate storage transistor. The bias component is selected to supply less source current at lower source bias and more source current at higher source bias. The bias component comprises, according to one aspect of the invention, a stable current source in parallel with a load. According to another embodiment of the invention, the stable current source comprises a current mirror designed to supply a fixed current level.

An embodiment of the invention includes an integrated circuit memory. The integrated circuit memory includes:

a memory array of flash EPROM memory cells having control gates, floating gates, sources and drains;

a plurality of bit lines, each coupled to the drains of a column of cells in the memory array;

a plurality of word lines, each coupled to the control gates of a row of cells in the memory array;

a plurality of virtual ground terminals, each coupled to the sources of a plurality of blocks of cells in the memory array; and circuitry, coupled to the plurality of virtual ground terminals, the circuitry selected to maintain drain current of a selected memory cell at a substantially stable value during programming.

An embodiment of the invention includes a method for programming selected floating gate storage transistors, in a data storage device including a plurality of floating gate storage transistors having respective control gates, sources, and drains. The method includes supplying a gate programming potential across the control gate and the source to move charge in the selected floating gate and maintaining drain current of the selected floating gate transistor at a substantially stable value during programming.

BRIEF DESCRIPTION OF THE DRAWINGS

The invention is illustrated by way of example, and not limitation, in the drawings.

FIG. 1-B shows an I-V curve for a source bias component, according to an embodiment of the invention.

FIG. 1-C shows a source bias component coupled to a cell, according to an embodiment of the invention.

FIG. 1-D shows a MOS device as current source, according to an embodiment of the invention.

FIG. 1-E shows an active load and passive load, according to an embodiment of the invention.

FIG. 1-F shows a source bias component, according to an embodiment of the invention.

FIG. 1-G also shows a source bias component, according to an embodiment of the invention.

FIG. 2-B shows a resistor I-V curve, according to an embodiment of the invention.

FIG. 2-C shows a MOS diode I-V curve, according to an embodiment of the invention.

FIG. 2-D shows an I-V curve for a MOSFET in parallel with a resistor, according to an embodiment of the invention.

FIG. 2-E shows an I-V curve for a MOSFET in parallel with a diode, according to an embodiment of the invention.

FIG. 3-B shows a flash EPROM triple well cell, according to an embodiment of the invention.

DETAILED DESCRIPTION

Figure 1A:
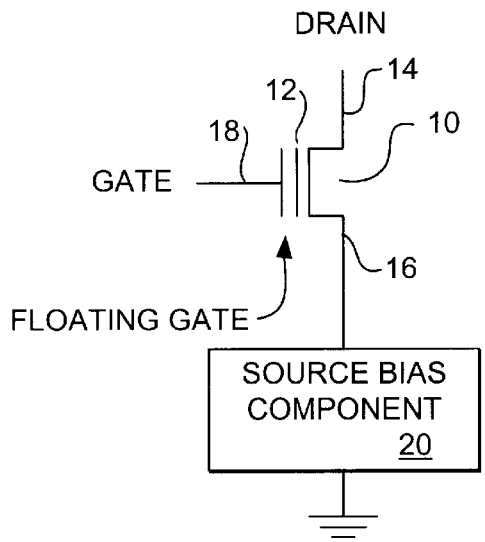
FIG. 1-A shows a floating gate coupled to a source bias component, according to an embodiment in the invention.
Figure 1B:
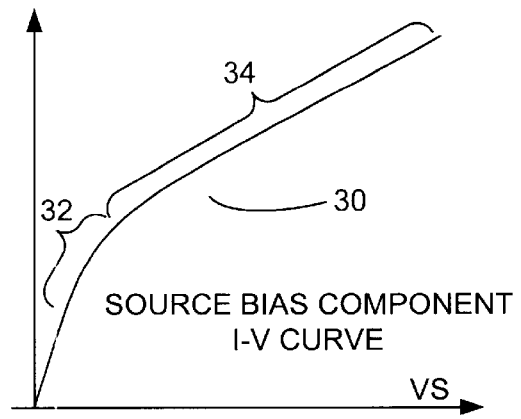
Figure 1C:
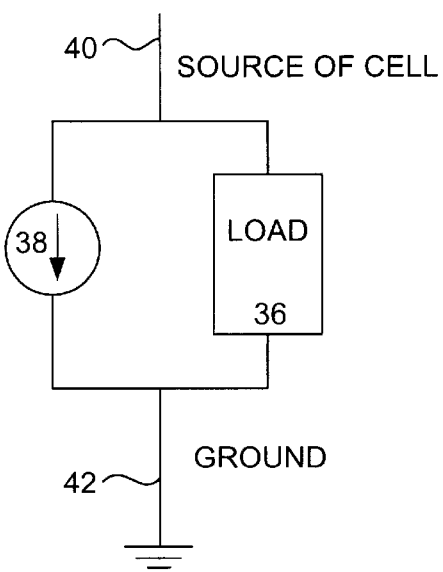
Figure 1D:
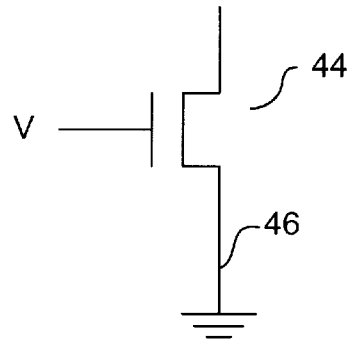
Figure 1E:
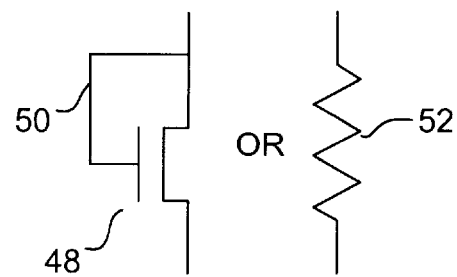
Figure 1F:
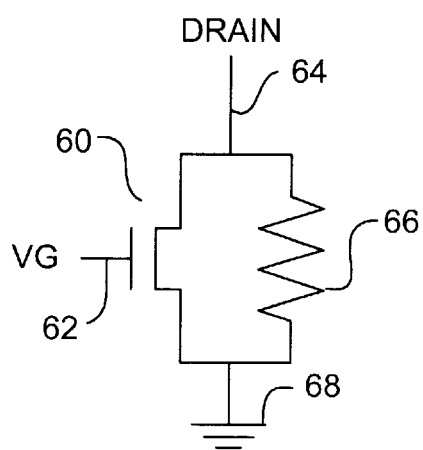
Figure 1G:
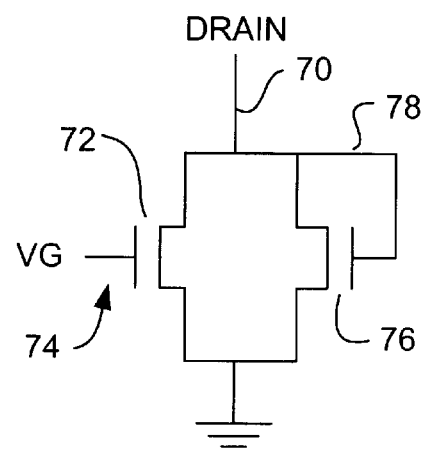
Figure 2A:
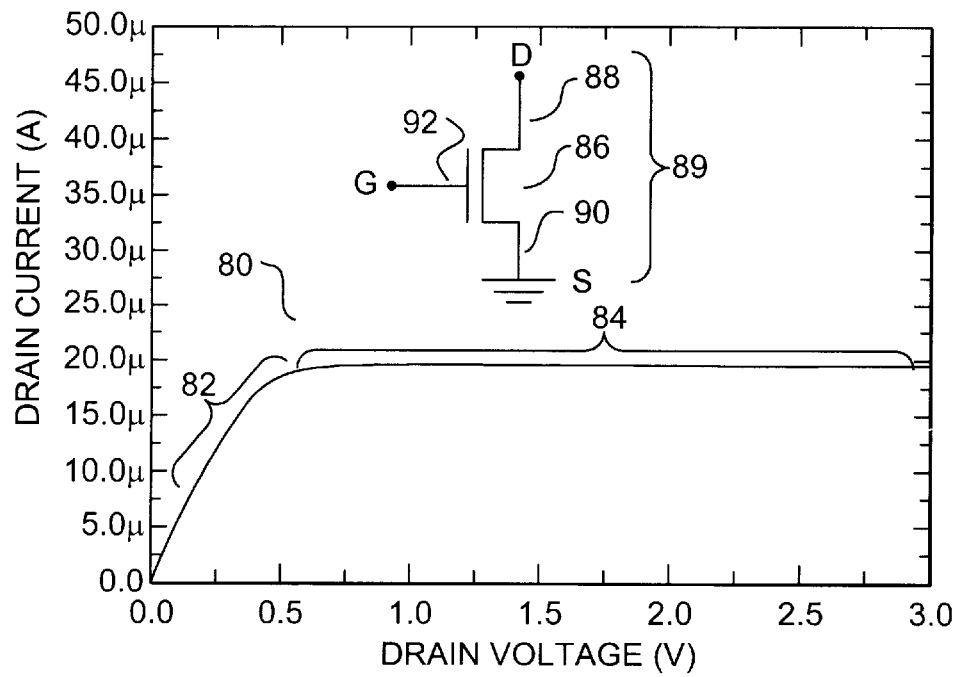
FIG. 2-A shows a MOSFET I-V curve, according to an embodiment of the invention.
Figure 2B:
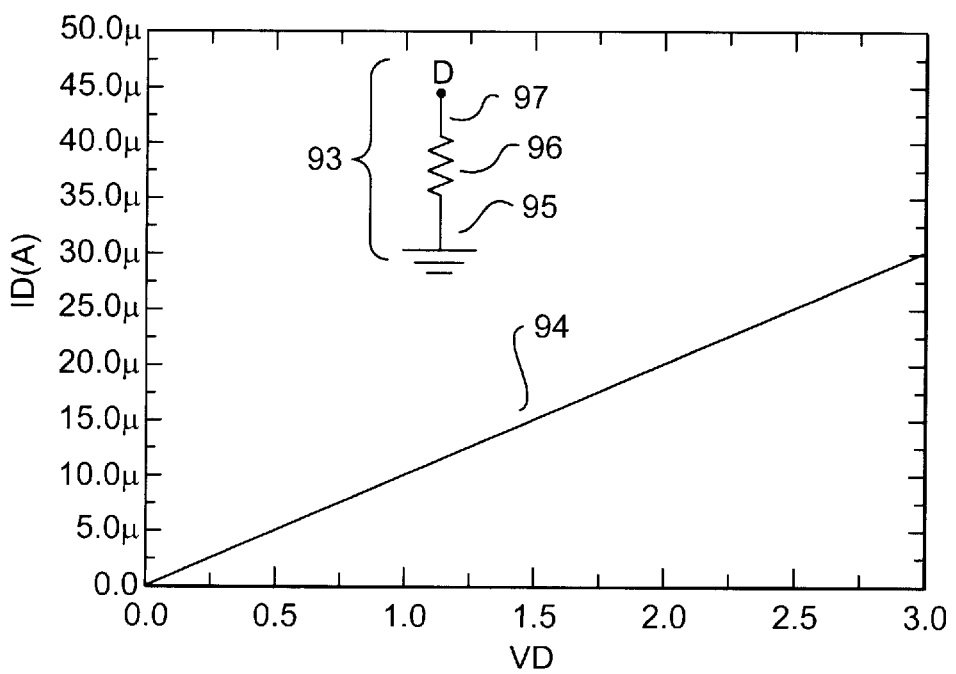
Figure 2C:
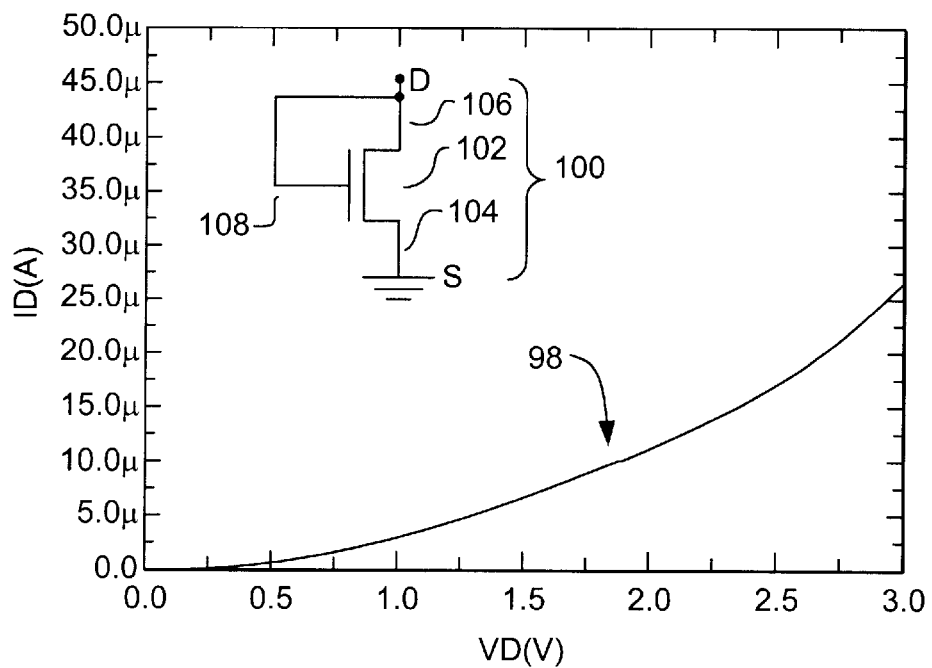
Figure 2D:
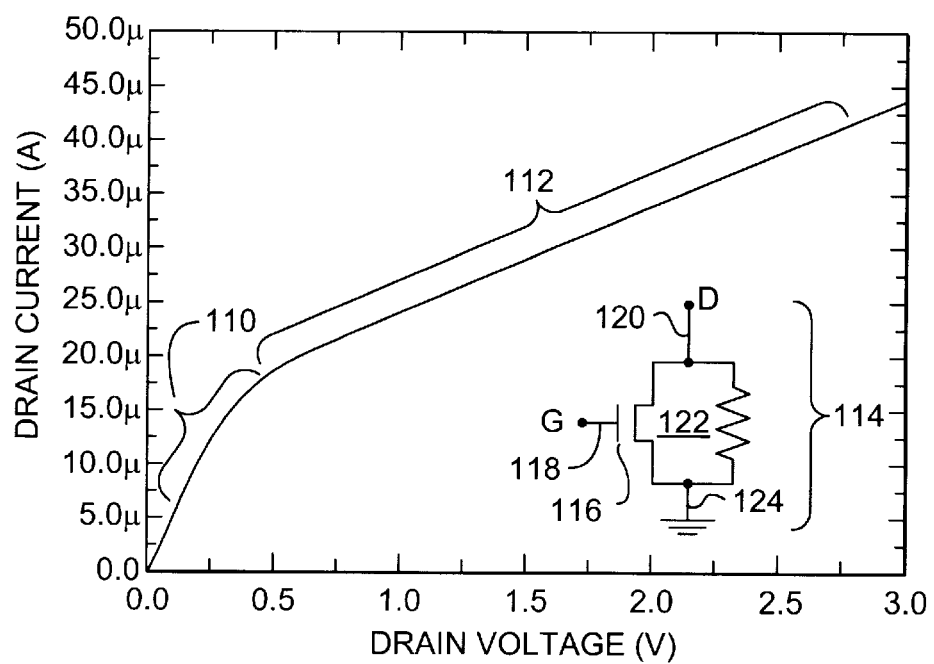
Figure 2E:
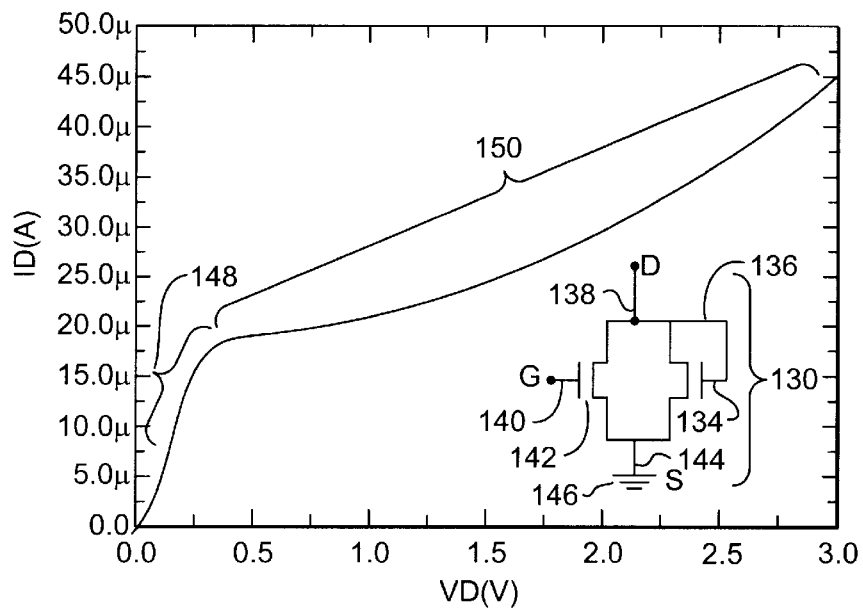

The following is a description of embodiments of the invention. The embodiments shown help to illustrate the invention. However, it is not intended that the invention be limited to the precise embodiments shown.

FIG. 1-A shows a floating gate coupled to a source bias component, according to an embodiment in the invention. FIG. 1-A shows a floating gate transistor 10, which has a drain 14, floating gale 12, control gate 18, and source 16. The source 16 is coupled to a source bias component 20, which is coupled to ground. Thus, one cell in a bit line, according to an embodiment of the invention, is selected and connected to a source bias component which may be a pass-gate transistor as shown. The source bias component 20 is used to provide lower current at lower source bias and higher current at higher source bias.

FIG. 1-B shows an I-V curve for a source bias component, according to an embodiment of the invention, as shown, the source bias component 20 helps to provide lower current at lower source bias and higher current at higher source bias. Curve 30 shows the relationship between source current (IS) and source voltage (VS). Region 34 of curve 30 shows a proportional relationship between source current and source bias.

FIG. 1-C shows a source bias component coupled to a cell, according to an embodiment of the invention. Source bias component 20 may consist of a stable current source and parallel with a load. The stable current source may consist of a current mirror a MOS device, and the load may consist of a diode or a resistor. As shown in FIG. 1-C source of cell 40 is coupled to current source 38, in parallel with load 36, which are both coupled to ground 42.

FIG. 1-D shows a MOS device as current source, according to an embodiment of the invention. Thus, one terminal of MOS device 44 is coupled to a source of the cell, and the other terminal is coupled to ground 46.

FIG. 1-E shows an active load and passive load, according to an embodiment of the invention. Active load comprises biased transistor 48. Passive load may comprise resistor 52.

Thus, the MOS device is biased at a designated value, or the current mirror is designed to supply fixed current level. The resistor and diode is chosen to control the IS-VS slope to limit the drain current variation. The channel width and channel length of the MOS device is large enough to avoid being affected by process variation so that stable current level can be maintained. The source current level is chosen according to the current supplied by a pumping circuit and the number of cells to be programmed. For example, if there are 256 bits to be programmed simultaneously and the current consumption is to be lower than 2.5 mA, the source bias element is then chosen to control the drain current to be less than 10 uA within the program voltage range.

According to another embodiment, the substrate of the cell is biased at a negative voltage for triple well technology. By applying the negative voltage to the substrate, the control gate voltage and drain voltage can be reduced. For example, if a −3V bias is applied to the substrate, the drain voltage can be reduced to be lower than 3V and the gate voltage is ramped from 3V to 6.5V which is suitable for low voltage application because negative voltage provided by the pumping circuit would be relatively easy to generate. The reduction of voltage can help reduce chip areas because the area of charge pump capacitance can be decreased and fabrication steps for the high voltage transistor can be reduced or simplified. Further, for 3V application, the drain voltage can be directly supplied from an external power supply instead of from a pump circuit.

FIG. 1-F shows a source bias component, according to an embodiment of the invention. The source bias component as shown consists of a long channel, wide width MOSFET 60 in parallel with resistor 66. The wide width of MOSFET 60 is to eliminate the effect of process variation. The resistor may be a polysilicon resistor, a diffusion resistor, or a well resistor. The MOSFET 60 is coupled to ground 68 along with resistor 66. The drain 64 side of the MOSFET 60 is coupled to the source of the flash cell. MOSFET 60 has a gate terminal 62.

FIG. 1-G shows a source bias component, according to an embodiment of the invention. As shown, the source bias component may consist of MOSFET 72 in parallel with a diode 78, implemented as a MOSFET 76 with gate shorted to drain side. Drain side 70 is coupled to the source side of the flash cell.

The voltage applied on the gate (62 or 74) of the MOSFET (60 or 72) is selected to provide a predetermined current level (approximately 20 uA to 50 uA), for example.

FIG. 2-A shows a MOSFET I-V curve, according to an embodiment of the invention. Bias component 89 includes MOSFET 86, which has drain terminal 88, source terminal 90, and gate terminal 92. Drain current curve 80 includes portion 82 and portion 84. Portion 84 shows drain current as relatively constant for various drain voltages.

FIG. 2-B shows a resistor I-V curve, according to an embodiment of the invention. Source bias component 93 includes resistor 96 which has a terminal 97 coupled to a source of the cell and a terminal 95 coupled to ground. Curve 94 shows drain current 94 versus drain voltage for a system using source bias component 93.

FIG. 2-C shows a MOS diode I-V curve, according to an embodiment of the invention. Bias component 100 includes MOS component 102 which has gate terminal 108 coupled to drain terminal 106 in order to implement a diode. Source terminal 104 of MOS 102 is coupled to ground. Curve 98 shows drain current versus drain voltage for a system using bias component 100.

FIG. 2-D shows an I-V curve for a MOSFET in parallel with a resistor, according to an embodiment of the invention. Bias component 114 includes resistor 122 and MOSFET 116. Resistor 122 and drain terminal of MOS 116 are coupled together at terminal 120, which is coupled to the source of the floating gate cell. MOSFET 116 and resistor 122 are coupled to ground 124. Curve comprising sections 110 and 112 shows drain current versus drain voltage for a system including bias component 114. For portion 112 drain current is proportional to drain voltage.

FIG. 2-E shows an I-V curve for a MOSFET in parallel with a diode, according to an embodiment of the invention. Bias component 130 includes MOSFET 142 and MOSFET 132. MOSFET 142 has a gate 140. Drain side of MOSFET 142 and 134 are coupled to terminal 138, which is coupled to the source of flash memory cell. Gate 134 of MOSFET 132 is coupled via line 136 to terminal 138 in order to implement a diode. Source side of MOSFET 142 and MOSFET 132 are coupled at terminal 144 to ground 146.

Since the source bias component is to provide a higher current at higher source bias and lower current at lower source bias, the MOSFET device is coupled with a diode or with a resistor in parallel to produce a desired I-V curve. Thus, the resistor or diode is used to modify the I-V curve slope of the MOSFET. The resistance of the resistor is chosen to keep the programming current constant and maybe in the range, for example, from 20 KOhms to 200 KOhms. FIG. 2-D shows result of connecting a MOSFET 116 with resistor in parallel, and FIG. 2-E shows the result of connecting the MOSFET 142 in parallel with a diode 134. Some differences exist in the I-V curve for the MOSFET 116 in parallel with resistor 122 as compared to the I-V curve for MOSFET 142 in parallel with diode 134. However, both configurations supply lower current at lower bias and higher current at higher bias to help reduce variation of programming current.

Figure 3A:
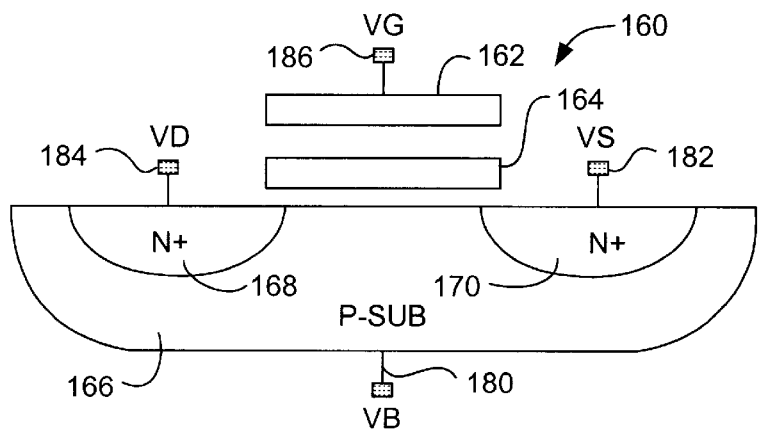
FIG. 3-A shows a flash EPROM, N channel type structure with P-well, according to embodiment of the invention.
Figure 3B:
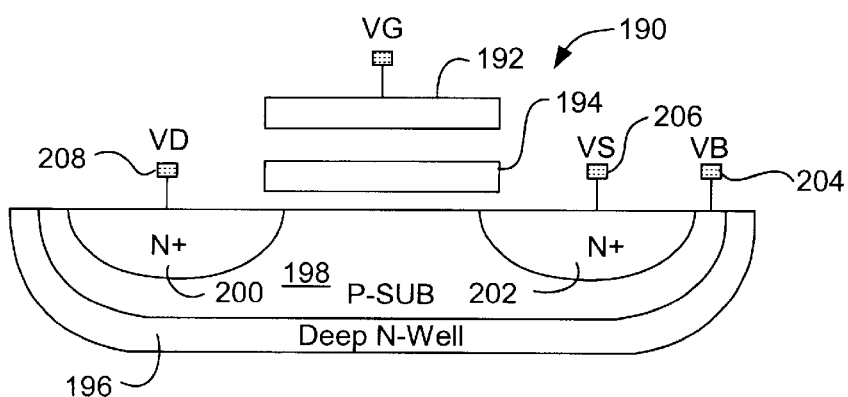

FIG. 3-A shows a flash EPROM cell 160, N channel type structure with P-well, according to an embodiment of the invention. The flash EPROM is a non-split gate. The flash EPROM includes control gate 162 with terminal 186, substrate 166, which is P based, source 170, which is N type, drain 168 which is N type, and floating gate 164. Source terminal is shown as 182 and drain terminal is shown as 184.

FIG. 3-B shows a flash EPROM triple well cell 190, according to an embodiment of the invention. Cell 190 includes control gate 192, floating gate 194, deep N-well 196, P substrate 198, source which is N type 202, drain 200 which is N type. Also shown are source terminal 206, drain terminal 208 and substrate terminal 204. The drain-source region is n+dopant and may consist of n- dopant, depending on the erasure method.

Figure 4:
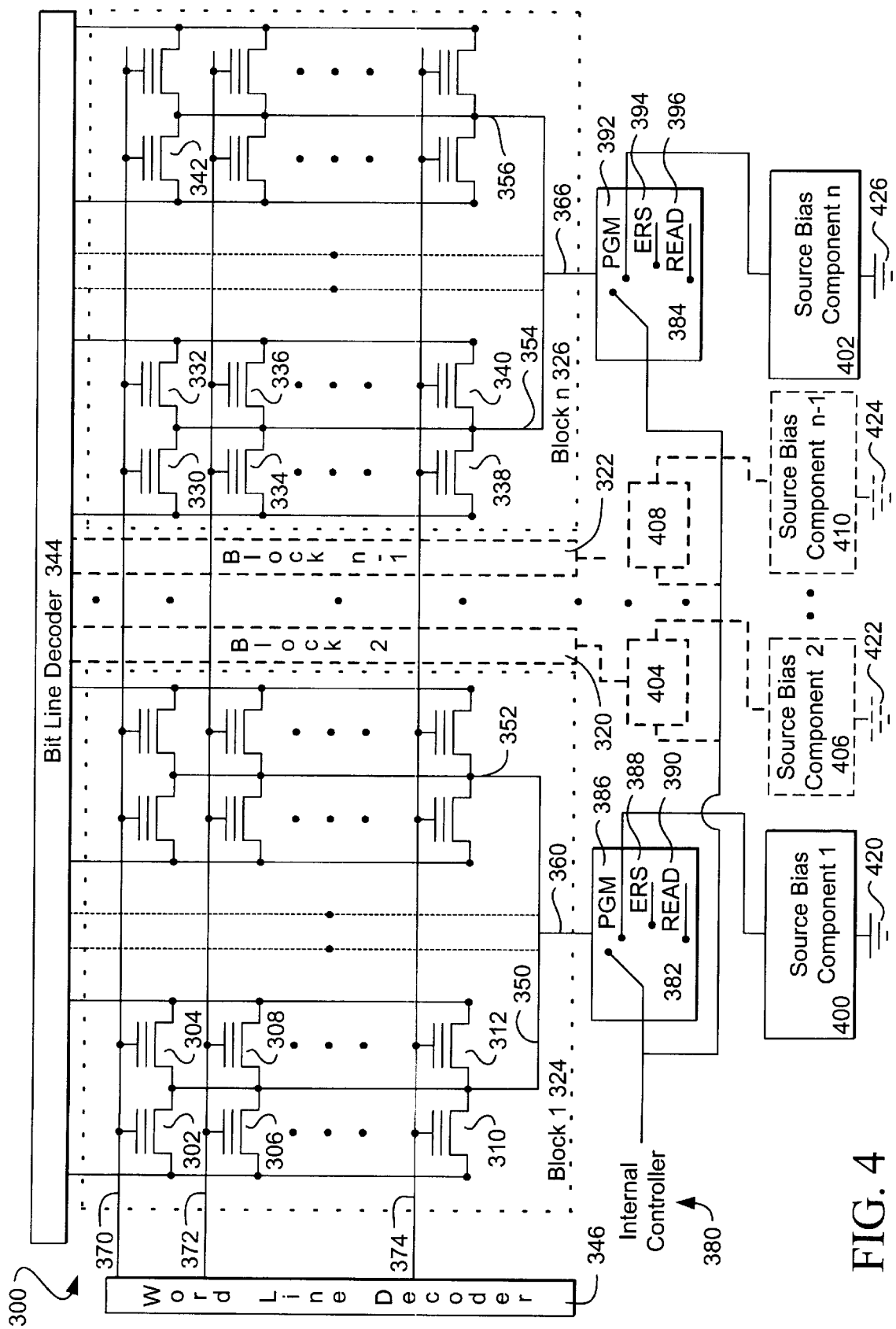
FIG. 4 shows an array structure, according to an embodiment of the invention.

FIG. 4 shows an array structure, according to an embodiment of the invention. Array 300 includes various blocks (e.g., block 1 324, block 2 320, block n−1 322, and block n 326), and the blocks include flash memory cells (e.g., 302, 304, 306, 308, 310, 312, 330, 332, 334, 336, 338, 340, and 342). Word lines are coupled to the control gates of various flash memory cells of array 300. For example, word line 370 is coupled to, among others, flash memory cells 302, 304, 330, 332, and 342. Similarly, word line 372 is coupled to, among others, flash memory cells 306, 308, 334, and 336, and word line 374 is coupled to, among others, memory cells 310, 312, 338, and 340. Word line decoder 346 is coupled to respective word lines and selects the appropriate word line thus selecting a row of cells in memory array 300. Here, word line decoder 346 is coupled to, among others, word lines 370, 372, and 374. Bit line decoder 344 selects the appropriate bit line of array 300.

Internal controller 380 causes source bias components (e.g., 400, 406, 410, and 402) to be selectively coupled to the appropriate bit line during programming. For example, switch 382 causes line PGM 386 (for programming) to be coupled to bit lines 352 and 350 via connection 360 to source bias component 1 400. In this way, during programming, block 1 324 is provided with a source bias component, which is coupled to ground 420. The number of source bias components depends on the number of bias to be programmed simultaneously. Each source bias component, according to an embodiment of the invention, is coupled to one selected cell in one bit line. Other functions may be switched through switch 382, for example, ERS 388 (erase function) or READ 390. Switch 404 allows switching of source bias component 2 406 to the appropriate bit line of block 2 320. Similarly, switch 408 allows switching of block n−1 322 to source bias component n−1 410. Switch 384 allows coupling of source bias component n 402 to connection 336 of block n 326. Connection 366 couples bit lines of block n 326, for example, line 354 and line 356. During programming, the drain voltage of programmed cells is fixed, and the control gate voltage can be fixed, stepping or ramped as preferred. One cell in a bit line is selected and connected to a source bias component, through a pass-gate transistor, according to one embodiment of the invention. The source bias component is used to provide lower current at lower source bias and higher current at higher source bias as described.

Figure 5:
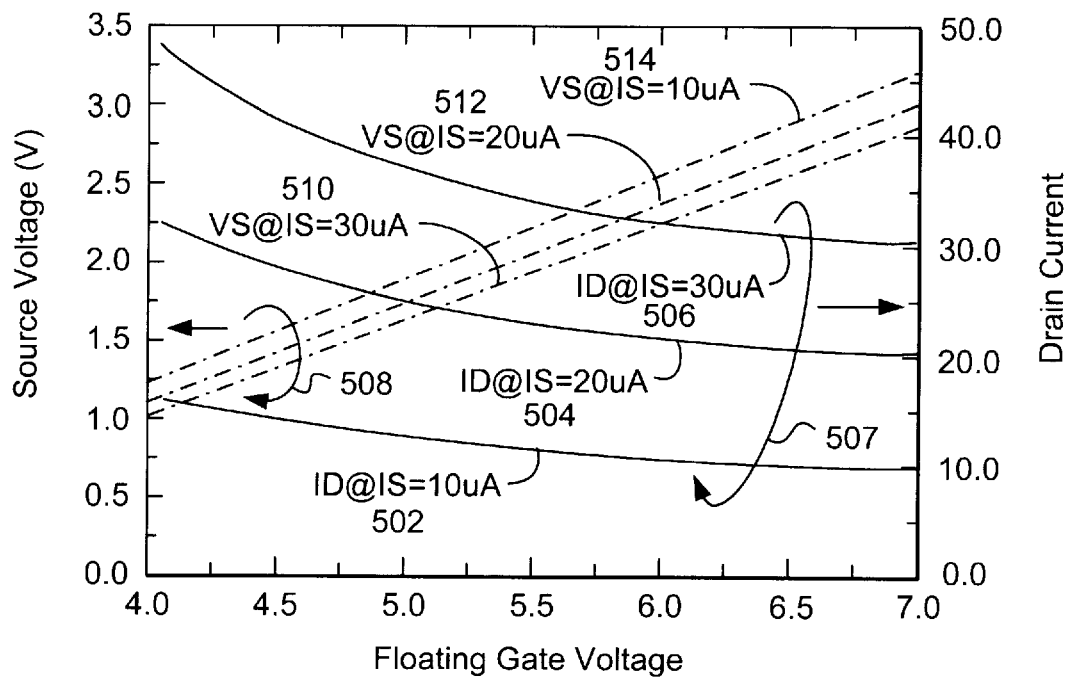
FIG. 5 shows a relationship of the drain current and source voltage to floating gate voltage in an exemplary system or systems.

FIG. 5 shows a relationship of the drain current and source voltage to floating gate voltage in an exemplary system or systems. The source voltage traces 508 are shown for source voltage versus floating gate voltage. For example trace 510 shows source voltage at source current of 30 microamps, trace 512 shows source voltage at source current of 20 microamps, and trace 514 shows source voltage at source current of 10 microamps. Drain currents 507 show drain currents 502, 504, and 506 versus the floating gate voltage. For example, trace 502 shows drain current at source current of 10 microamps, trace 504 shows drain current at source current of 20 microamps, and trace 506 shows drain current at source current of 30 microamps. There is a tendency that under the same source current, drain current increases and source bias decreases as floating gate voltage decreases. For a fixed source current, the higher drain current at a lower source voltage may be due to higher substrate currents generated. Thus, drain currents may vary in a wide range even if the source current is kept constant since some of the drain current flows into the substrate instead of flowing into the source. An advantage of providing a source bias component that supplies less source current at lower source bias to keep a constant drain current is that stable current consumption may be achieved while programming.

Figure 6:
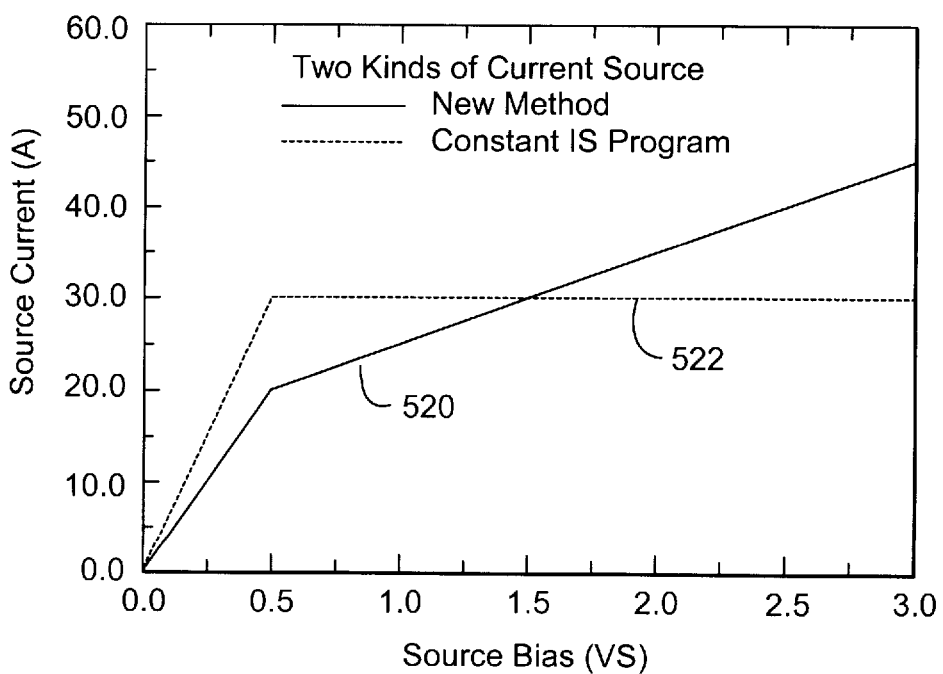
FIG. 6 shows a relationship between source current and source bias, according to an embodiment of the invention.

FIG. 6 shows a relationship between source current and source bias, according to an embodiment of the invention. Trace 522 shows source current versus source bias for a constant source current technique. Trace 520 shows source current versus source bias according to an embodiment of the invention in which less source current is supplied at lower source bias.

Figure 7:
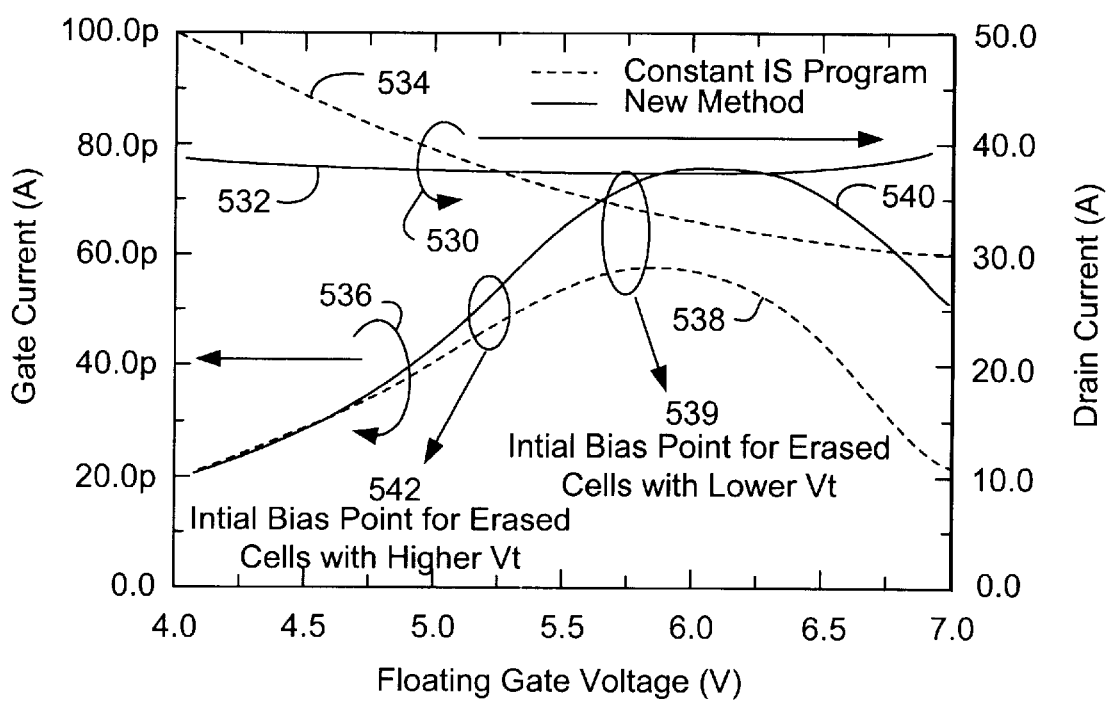
FIG. 7 shows gate current and drain current versus floating gate voltage, according to an embodiment of the invention.

FIG. 7 shows gate current and drain current versus floating gate voltage, according to an embodiment of the invention. FIG. 7 shows characteristics for a non-split gate flash EPROM cell with control gate and floating gate shorted where channel length is 0.6 um, channel width is 0.4 um, and tunnel oxide thickness is 100 Angstroms. Traces 530 show drain current versus floating gate voltage. Trace 534 shows drain current versus floating gate voltage under a constant source current technique. Trace 532 shows drain current versus floating gate voltage according to an embodiment of the invention. Traces 536 show gate current versus floating gate voltage. Trace 538 shows gate current versus floating gate voltage under a technique with constant source current. Trace 540 shows gate current versus floating gate voltage according to an embodiment of the invention. Point 542 is an initial bias point for erased cells with higher threshold voltage. Point 539 is an initial bias point for erased cells with lower threshold voltage. Under a method according to an embodiment of the invention, drain current is nearly constant and gate current is higher, and under such conditions a higher injection rate can be achieved. For a normal memory array, the initial threshold voltages erased cells before programming is not a fixed value but fall within a distribution caused by process variation. Thus, for a fixed drain and control gate voltage, low threshold voltage cells have a higher floating gate voltage. Higher threshold voltage cells have a lower floating gate voltage where the low threshold voltage cell is a cell with a low side threshold voltage after erasure, and the high threshold voltage cell is a cell with a high side threshold voltage after erasure. Thus, according to an embodiment of the invention, $$Vfg=ag'*Vcg+ad*VD+as*VS+ag(VtE\_UV-VtE)$$

where ag, ad, and as stand for the gate coupling ratio, drain coupling ratio, and source coupling ratio respectively, and Vfg is the floating gate voltage. Vcg is the control gate voltage. VtE_UV is the UV state threshold voltage of a flash EPROM cell. VtE is the threshold voltage of a flash EPROM cell.

To reduce the programmed threshold voltage distribution bandwidth, the control gate voltage can be chosen to keep the low threshold voltage cells biased at a high injection efficiency point so that the low threshold voltage cells gain more charge to reduce the programmed threshold voltage difference between high threshold voltage cells and low threshold voltage cells. As can be observed from FIG. 7, gate current of low threshold voltage cells according to an embodiment of the invention is much higher than that with a constant source current technique, but the gate current difference between the two methods for high threshold voltage cells is minor. Thus, low threshold voltage cells, according to an embodiment of the invention, would program faster, and the programmed threshold voltage difference between high threshold voltage cells and low threshold voltage cells would be further decreased.

Figure 8:
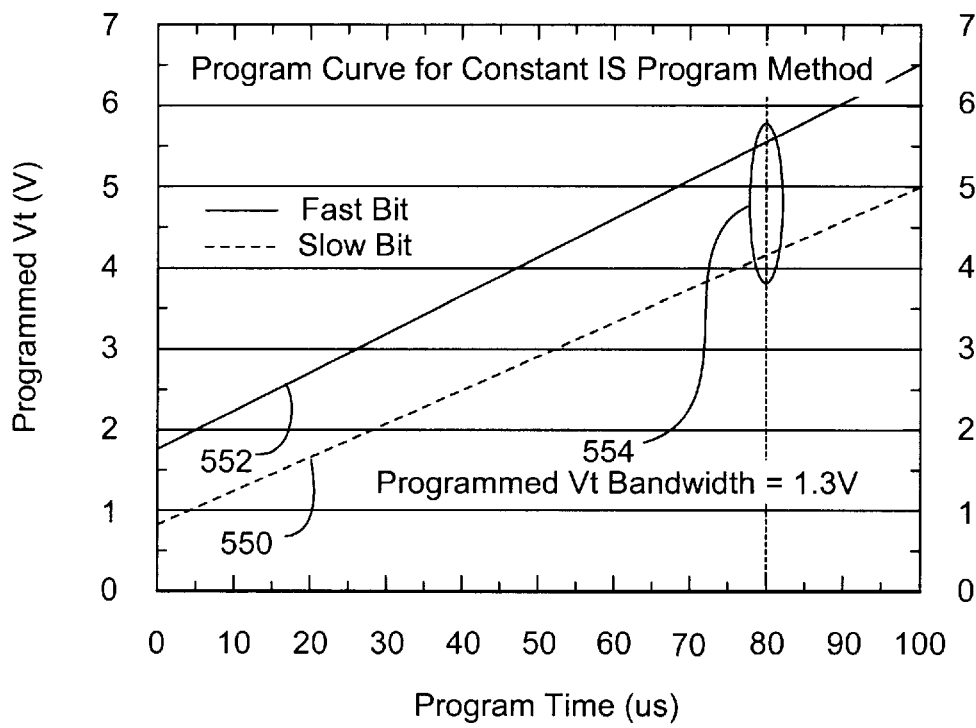
FIG. 8 shows a programming threshold voltage curve according to an embodiment of the invention.

FIG. 8 shows a programming threshold voltage curve according to an embodiment of the invention. Trace 552 shows program threshold voltage for a fast bit versus program time for a constant source current technique. Point 554 shows where threshold voltage bandwidth equals 1.3 volts.

Figure 9:
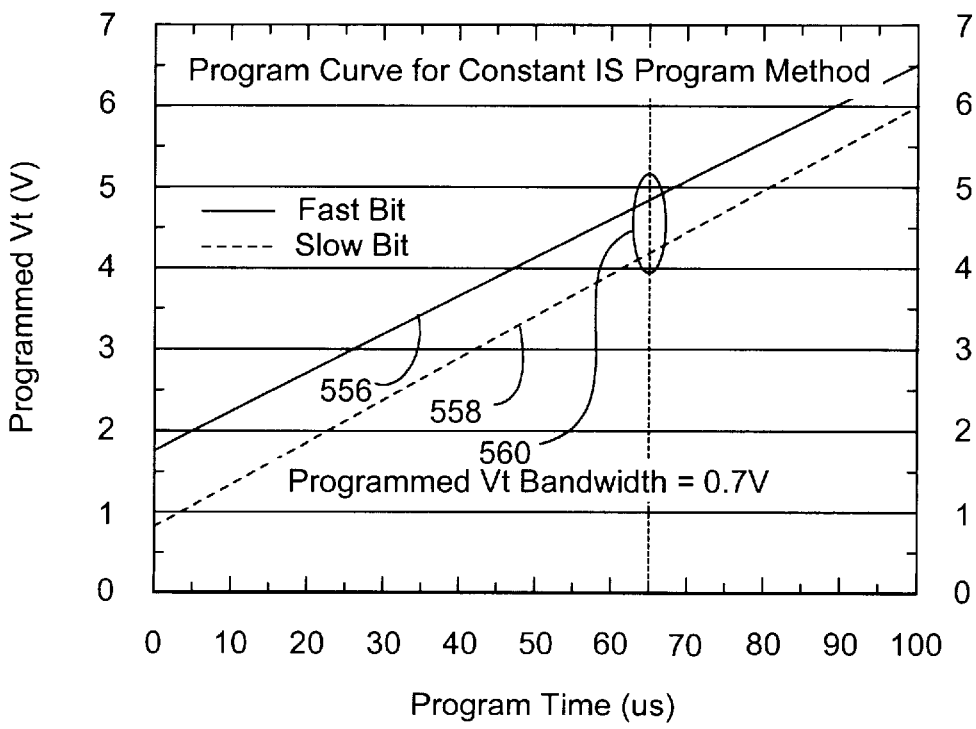
FIG. 9 also shows a programming threshold voltage curve according to an embodiment of the invention.

FIG. 9 also shows a programming threshold voltage curve according to an embodiment of the invention. Trace 558 shows programmed threshold voltage versus program time according to an embodiment of the invention with stable drain voltage for a slow bit. Trace 556 shows programmed threshold voltage versus program time according to an embodiment of the invention with stable drain voltage for a fast bit. Point 560 shows where programmed threshold voltage bandwidth equals 0.7 volts.

In the examples of FIG. 8 and FIG. 9, erased low threshold voltage cell is defined to be 0.8V, and erased high threshold voltage cell is defined to be 1.8V, where the threshold voltage distribution is 1V. Drain voltage is chosen to be 6V to achieve higher injection efficiency, and this drain voltage can be reduced if program time is increased. Gate voltage is ramped from 6V to 9.5V in 70 microseconds. The ramping rate of control gate voltage is chosen to maintain a high gate injection efficiency for cells with lower threshold voltage during programming period. The programming current is chosen to be less than 40 uA so that 64 bits can be programmed simultaneously under a 2.5 mA power supply. Thus, comparing FIG. 8, which shows curves for constant source code programming, and FIG. 9, which shows program curves for stable current programming, it is seen that the program's threshold voltage bandwidth for constant source current programming should be 1.3V, and the threshold bandwidth would be 0.7V for a stable drain current programming technique. The more compact threshold voltage bandwidth with the stable current programming technique may occur because the slow bit is biased at a higher injection rate which is shown in FIG. 7. Cells are programmed to be higher than 4V in 65 microseconds by using a constant drain current technique, while 80 microseconds are needed when using a constant source current technique. Thus, an advantage of a constant drain current technique for programming is that programming time may be reduced approximately twenty percent.

Figure 10:
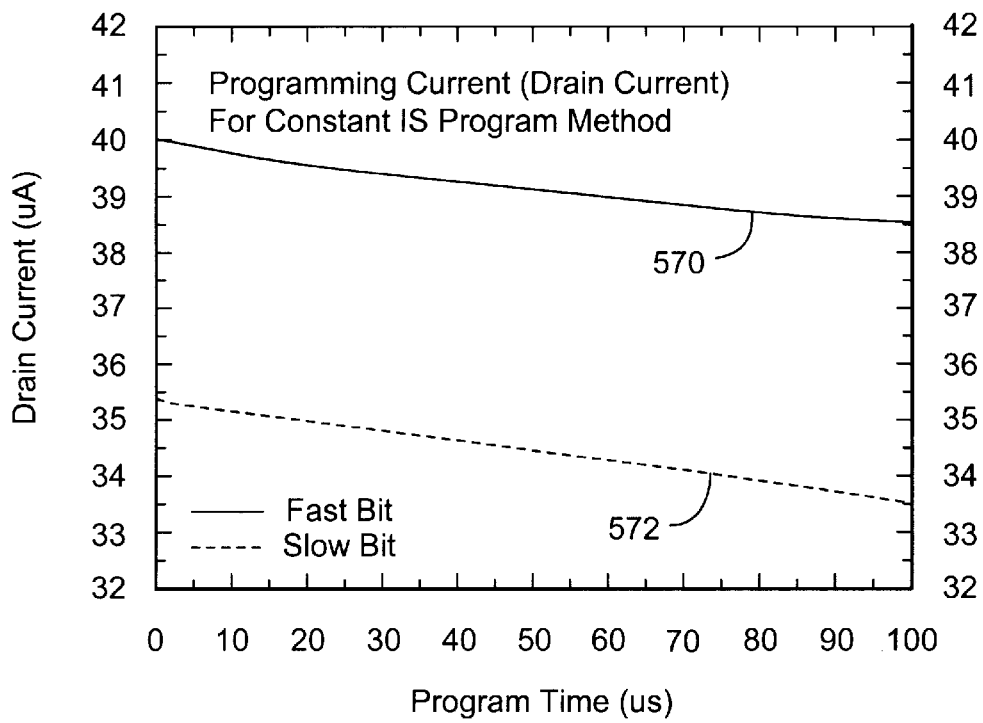
FIG. 10 shows a relationship between drain current and program time, according to an embodiment of the invention.

FIG. 10 shows a relationship between drain current and program time, according to an embodiment of the invention. Trace 570 shows drain current versus program time for a fast bit for a constant source current technique. Trace 572 shows drain current versus program time for a slow bit for a constant source current technique.

Figure 11:
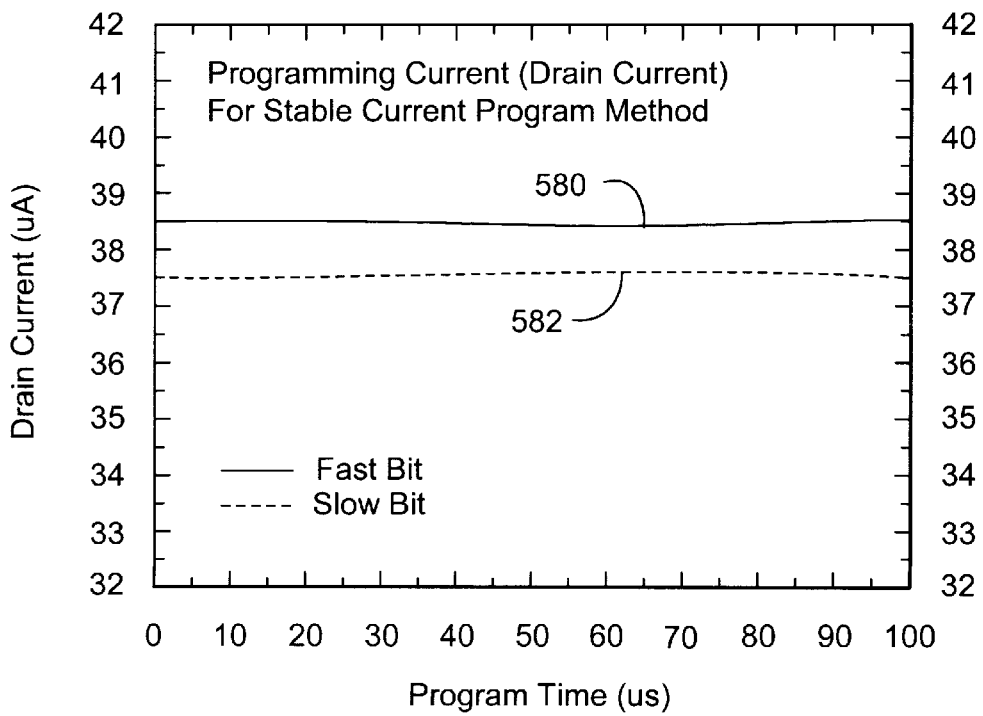
FIG. 11 sews a relationship between drain current and program time, according to an embodiment of the invention.

FIG. 11 shows a relationship between drain current and program time, according to an embodiment of the invention. Trace 580 shows drain current versus program time for a fast bit for a constant drain current technique. Trace 582 shows drain current versus program time for a slow bit for a constant drain current technique. Thus, from FIG. 10 and FIG. 11, it is seen that programming current per cell for a constant source current technique may range from 30 uA to 41 uA because of process variation if source current is fixed at 30 uA. For a constant drain current technique, programming current is kept closer to 40 uA. An advantage of such a technique is that the current supply circuit (charge pump) can be more efficiently used, and higher efficiency can be gained.

Various embodiments of the invention have been illustrated in the figures and have been described in the corresponding text of this application. This foregoing description is not intended to limit the invention to the precise forms disclosed. Rather, the invention is to be construed to the full extent allowed by the following claims and their equivalents.

What is claimed is:

1. In a data storage device including a plurality of floating gate storage transistors having respective control gates, sources, and drains, an apparatus for programming selected floating gate storage transistors, the apparatus comprising:
   a voltage supply circuit, coupled to the control gate and the source of a selected floating gate storage transistor, to supply a gate programming potential across the control gate and the source to move charge in the floating gate; and
   circuitry, coupled to the selected floating gate storage transistor, the circuitry selected to maintain drain current of the selected floating gate transistor at a substantially stable value during programming.

2. In a data storage device including a plurality of floating gate storage transistors having respective control gates, sources, and drains, an apparatus for programming selected floating gate storage transistors, the apparatus comprising:
   a voltage supply circuit, coupled to the control gate and the source of a selected floating gate storage transistor, to supply a gate programming potential across the control gate and the source to move charge in the floating gate; and
   circuitry, coupled to the selected floating gate storage transistor, the circuitry selected to maintain drain current of the selected floating gate transistor at a substantially stable value during programming, wherein the circuitry comprises a stable current source in parallel with a load, the stable current source coupled to the source of the selected floating gate transistor.

3. The apparatus of claim 2, wherein the stable current source comprises a current mirror designed to supply a fixed current level, the current mirror coupled to the source of the selected floating gate transistor.

4. The apparatus of claim 2, wherein the stable current source comprises a MOS device.

5. The apparatus of claim 2, wherein the load comprises a resistor chosen to control a slope of a curve of source current versus source voltage such that drain current variation is limited.

6. The apparatus of claim 2, wherein the load comprises a diode chosen to control a slope of a curve of source current versus source voltage such that drain current variation is limited.

7. The apparatus of claim 1, wherein a substrate of the selected floating gate storage transistor is biased at a negative voltage, allowing control gate voltage and drain voltage to be reduced.

8. The apparatus of claim 1, including control circuitry coupled to the voltage supply circuit to vary the gate programming potential during a programming interval.

9. The apparatus of claim 8, wherein a rate of varying the gate programming potential is chosen to improve gate injection efficiency for a cell with a relatively low threshold voltage.

10. The apparatus of claim 1, wherein the floating gate storage transistor comprises a non-split floating gate transistor.

11. In a data storage device including a plurality of floating gate storage transistors having respective control gates, sources, and drains, an apparatus for programming selected floating gate storage transistors, the apparatus comprising:
   a voltage supply circuit, coupled to the control gate and the source of a selected floating gate storage transistor, to supply a gate programming potential across the control gate and the source to move charge in the floating gate; and
   a bias component, coupled to the source of the selected floating gate storage transistor, the bias component selected to supply less source current at lower source bias and more source current at higher source bias.

12. In a data storage device including a plurality of floating gate storage transistors having respective control gates, sources, and drains, an apparatus for programming selected floating gate storage transistors, the apparatus comprising:
   a voltage supply circuit, coupled to the control gate and the source of a selected floating gate storage transistor, to supply a gate programming potential across the control gate and the source to move charge in the floating gate; and
   a bias component, coupled to the source of the selected floating gate storage transistor, the bias component selected to supply less source current at lower source bias and more source current at higher source bias, wherein the bias component comprises a stable current source in parallel with a load.

13. The apparatus of claim 12, wherein the stable current source comprises a current mirror designed to supply a fixed current level.

14. The apparatus of claim 12, wherein the stable current source comprises a MOS device.

15. The apparatus of claim 12, wherein the load comprises a resistor chosen to control a slope of a curve of source current versus source voltage such that drain current variation is limited.

16. The apparatus of claim 12, wherein the load comprises a diode chosen to control a slope of a curve of source current versus source voltage such that drain current variation is limited.

17. The apparatus of claim 11, wherein a substrate of the selected floating gate storage transistor is biased at a negative voltage, allowing control gate voltage and drain voltage to be reduced.

18. The apparatus of claim 11, including control circuitry coupled to the voltage supply circuit to vary the gate programming potential during a programming interval.

19. The apparatus of claim 18, wherein a rate of varying the gate programming potential is chosen to improve gate injection efficiency for a cell with a relatively low threshold voltage.

20. The apparatus of claim 11, wherein the floating gate storage transistor comprises a non-split floating gate transistor.

21. An integrated circuit memory, comprising:
   a memory array of flash EPROM memory cells having control gates, floating gates, sources and drains;
   a plurality of bit lines, each coupled to the drains of a column of cells in the memory array;
   a plurality of word lines, each coupled to the control gates of a row of cells in the memory array;
   a plurality of virtual ground terminals, each coupled to the sources of a plurality of blocks of cells in the memory array; and
   circuitry, coupled to the plurality of virtual ground terminals, the circuitry selected to maintain drain current of a selected memory cell at a substantially stable value during programming.

22. The integrated circuit memory of claim 21, wherein the circuitry comprises a stable current source in parallel with a load.

23. The integrated circuit memory of claim 22, wherein the stable current source comprises a current mirror designed to supply a fixed current level.

24. The integrated circuit memory of claim 22, wherein the stable current source comprises a MOS device.

25. The integrated circuit memory of claim 22, wherein the load comprises a resistor chosen to control a slope of a curve of source current versus source voltage such that drain current variation is limited.

26. The integrated circuit memory of claim 22, wherein the load comprises a diode chosen to control a slope of a curve of source current versus source voltage such that drain current variation is limited.

27. The integrated circuit memory of claim 21, wherein a substrate of the cells is biased at a negative voltage, allowing control gate voltage and drain voltage to be reduced.

28. The integrated circuit memory of claim 21, including control circuitry coupled to the voltage supply circuit to vary the gate programming potential during a programming interval.

29. The integrated circuit memory of claim 28, wherein a rate of varying the gate programming potential is chosen to improve gate injection efficiency for a cell with a relatively low threshold voltage.

30. The integrated circuit memory of claim 21, wherein the cells comprise non-split floating gate transistors.

31. In a data storage device including a plurality of floating gate storage transistors having respective control gates, sources, and drains, a method for programming selected floating gate storage transistors comprising:

supplying a gate programming potential across the control gate and the source to move charge in the selected floating gate; and maintaining drain current of the selected floating gate transistor at a substantially stable value during programming.

32. The method of claim 31, comprising providing a stable current source in parallel with a load, the stable current source coupled to the source of the selected floating gate transistor.

33. The method of claim 32, wherein the stable current source comprises a current mirror designed to supply a fixed current level, the current mirror coupled to the source of the selected floating gate transistor.

34. The method of claim 32, wherein the stable current source comprises a MOS device.

35. The method of claim 32, wherein the load comprises a resistor chosen to control a slope of a curve of source current versus source voltage such that drain current variation is limited.

36. The method of claim 32, wherein the load comprises a diode chosen to control a slope of a curve of source current versus source voltage such that drain current variation is limited.

37. The method of claim 31, wherein a substrate of the selected floating gate storage transistor is biased at a negative voltage, allowing control gate voltage and drain voltage to be reduced.

38. The method of claim 31, including varying the gate programming potential during a programming interval.

39. The method of claim 38, wherein a rate of varying the gate programming potential is chosen to improve gate injection efficiency for a cell with a relatively low threshold voltage.

40. The method of claim 21, wherein the floating gate storage transistor comprises a non-split floating gate transistor.

* * * * *